US011342203B2

(12) United States Patent
Jeong et al.

(10) Patent No.: US 11,342,203 B2
(45) Date of Patent: May 24, 2022

(54) SUBSTRATE CLEANING APPARATUS AND SUBSTRATE CLEANING METHOD USING THE SAME

(71) Applicant: SAMSUNG ELECTRONICS CO., LTD., Suwon-si (KR)

(72) Inventors: Jihoon Jeong, Seongnam-si (KR);
Mihyun Park, Seongnam-si (KR);
Yongsun Ko, Suwon-si (KR);
Kwangwook Lee, Seongnam-si (KR);
Kuntack Lee, Suwon-si (KR);
Hayoung Jeon, Hwaseong-si (KR);
Yongjhin Cho, Hwaseong-si (KR);
Jihoon Cha, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 37 days.

(21) Appl. No.: 16/739,409

(22) Filed: Jan. 10, 2020

(65) Prior Publication Data

US 2021/0020462 A1 Jan. 21, 2021

(30) Foreign Application Priority Data

Jul. 16, 2019 (KR) ........................ 10-2019-0085710

(51) Int. Cl.
*H01L 21/02* (2006.01)
*H01L 21/67* (2006.01)

(52) U.S. Cl.
CPC .. *H01L 21/67051* (2013.01); *H01L 21/02057* (2013.01); *H01L 21/6704* (2013.01); *H01L 21/6708* (2013.01)

(58) Field of Classification Search
None
See application file for complete search history.

(56) References Cited

U.S. PATENT DOCUMENTS

| 2014/0041685 A1 | 2/2014 | Kaneko et al. |
| 2014/0144464 A1 | 5/2014 | Kaneko et al. |
| 2014/0144465 A1 | 5/2014 | Kaneko et al. |
| 2015/0128994 A1 | 5/2015 | Kaneko et al. |

(Continued)

FOREIGN PATENT DOCUMENTS

| KR | 10-2014-0019741 A | 2/2014 |
| KR | 10-2014-0067892 A | 6/2014 |

(Continued)

*Primary Examiner* — Mikhail Kornakov
*Assistant Examiner* — Ryan L Coleman
(74) *Attorney, Agent, or Firm* — Lee IP Law, P.C.

(57) ABSTRACT

A substrate cleaning apparatus includes a support inside a chamber to hold a substrate, a first supply source inside the chamber that includes a first nozzle along a first direction and facing an upper surface of the support, the first nozzle to spray polymer and solvent onto the substrate to form a coating, and a second nozzle at an oblique angle to the first direction and facing an edge of the support to inject a hot gas toward the coating to volatilize the solvent, a second supply source inside the chamber and having a third nozzle facing the upper surface of the support to inject a peeling treatment to the coating to peel the coating from the substrate, and a third supply source inside the chamber and facing a lower surface of the support to inject the hot gas to heat a second surface of the substrate.

20 Claims, 9 Drawing Sheets

(56) References Cited

U.S. PATENT DOCUMENTS

2015/0128995 A1    5/2015  Kaneko et al.
2016/0035564 A1    2/2016  Aibara et al.
2016/0372320 A1*  12/2016  Emoto .............. H01L 21/68728
2020/0194281 A1*  6/2020  Yoshida ............ H01L 21/67023

FOREIGN PATENT DOCUMENTS

KR    10-2014-0067893 A    6/2014
KR    10-2017-0075770 A    7/2017
KR    10-2018-0062440 A    6/2018

\* cited by examiner

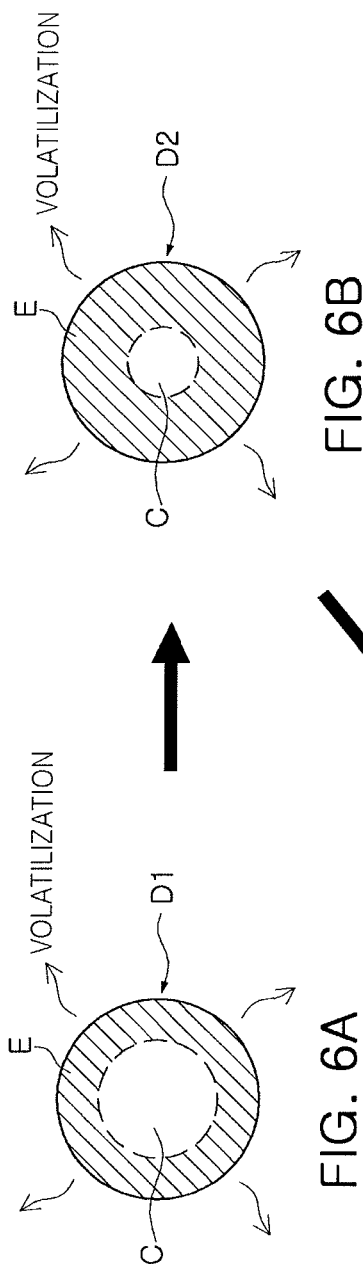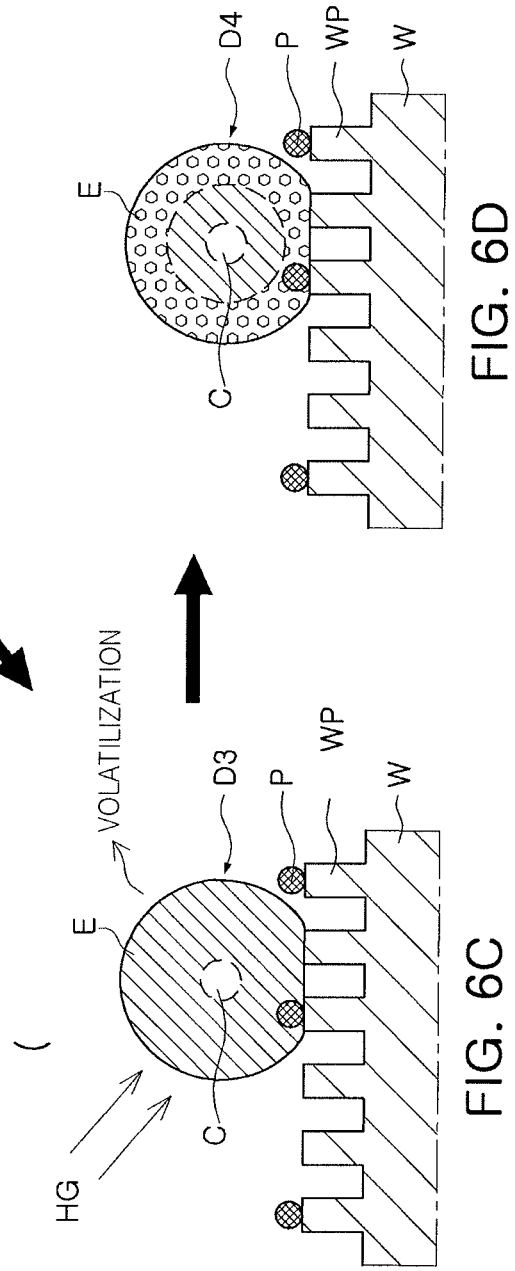

SUBSTRATE CLEANING APPARATUS AND SUBSTRATE CLEANING METHOD USING THE SAME

CROSS-REFERENCE TO RELATED APPLICATION

Korean Patent Application No. 10-2019-0085710, filed on Jul. 16, 2019, in the Korean Intellectual Property Office, and entitled: "Substrate Cleaning Apparatus and Substrate Cleaning Method Using the Same," is incorporated by reference herein in its entirety.

BACKGROUND

1. Field

The present disclosure relates to a substrate cleaning apparatus and a substrate cleaning method using the same.

2. Description of the Related Art

In a semiconductor manufacturing process, a series of processes are performed to form a semiconductor pattern on a substrate. When a particle is attached to the semiconductor pattern in any one of the series of processes, subsequent processes may not be performed properly. Therefore, it is important to remove particles from the semiconductor pattern of the substrate in each process.

SUMMARY

According to an example embodiment, a substrate cleaning apparatus includes a support inside a chamber, the support to hold a substrate, a first supply source inside the chamber, the first supply source having a first nozzle along a first direction and facing an upper surface of the support, the first nozzle to spray a mixture of a polymer and a volatile organic solvent onto a first surface of the substrate to form a coating film, and a second nozzle along a second direction that is at an oblique angle with respect to the first direction, the second nozzle facing an outermost edge of the upper surface of the support to inject a hot gas toward the coating film to volatilize the organic solvent in the coating film, a second supply source inside the chamber and having a third nozzle facing the upper surface of the support, the second supply source to inject a peeling treatment liquid to the coating film to peel off the coating film from the substrate, and a third supply source inside the chamber and facing a lower surface of the support, the lower surface being opposite the upper surface, and the third supply source to inject the hot gas to a second surface of the substrate to heat the substrate.

According to an example embodiment, a substrate cleaning method includes spraying a chemical, including a polymer and a volatile organic solvent, in a first direction, a direction normal with respect to a first surface of a substrate, to form a coating film on the first surface, injecting a hot gas onto the coating film in a second direction, oblique to the first direction, to volatilize the organic solvent included in the coating film, and injecting a peeling treatment liquid to the coating film to peel off and remove the coating film from the substrate.

According to an example embodiment, a substrate cleaning method includes spraying a chemical, including a polymer and an organic solvent, onto an upper surface of a substrate in a state of a droplet to form a coating film in which droplets of the chemical are stacked in a state of attaching particles of the upper surface of the substrate, injecting a hot gas to the coating film in a direction, oblique to the upper surface of the substrate, to volatilize the organic solvent included in the coating film, and injecting a peeling treatment liquid to the coating film to form cracking in the coating film, and introducing the peeling treatment liquid through the cracking to peel off the coating film, to which the particles are attached, on the upper surface of the substrate.

BRIEF DESCRIPTION OF DRAWINGS

Features will become apparent to those of skill in the art by describing in detail exemplary embodiments with reference to the attached drawings, in which:

FIGS. 6A to 6D illustrate a process in which a droplet, sprayed from a first nozzle, is solidified;

DETAILED DESCRIPTION

Hereinafter, example embodiments will be described with reference to the accompanying drawings.

Figure 1:
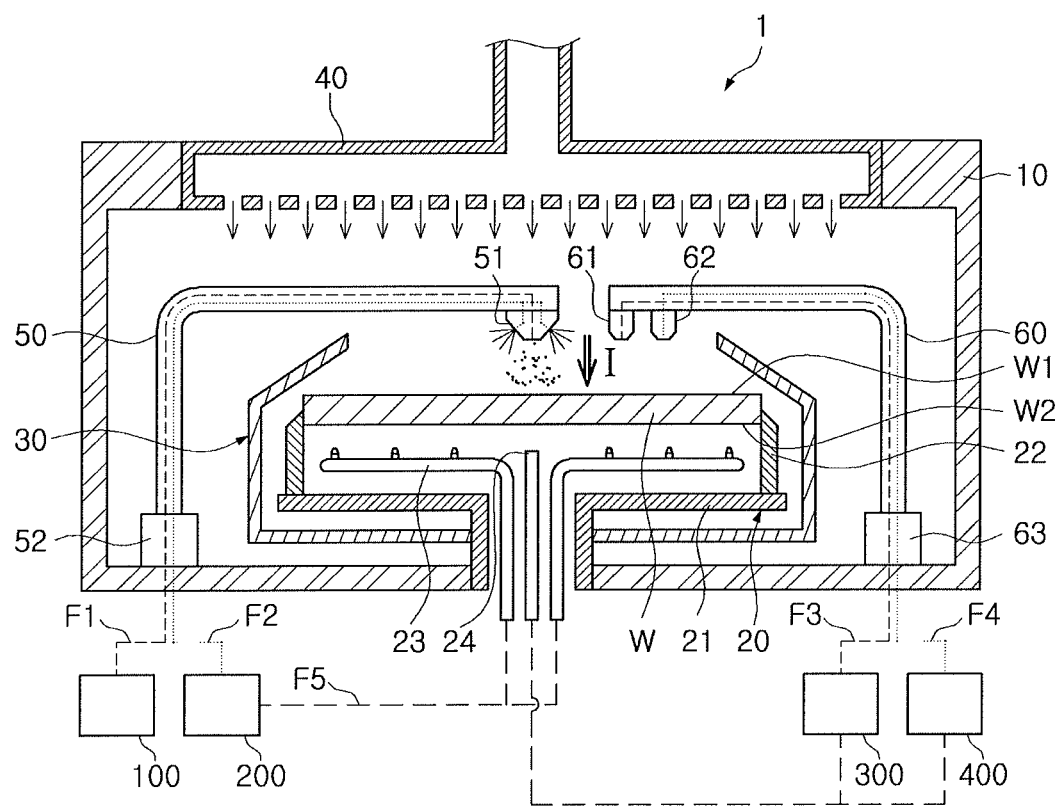
FIG. 1 illustrates a schematic diagram of a substrate cleaning apparatus according to an example embodiment.
Figure 2:
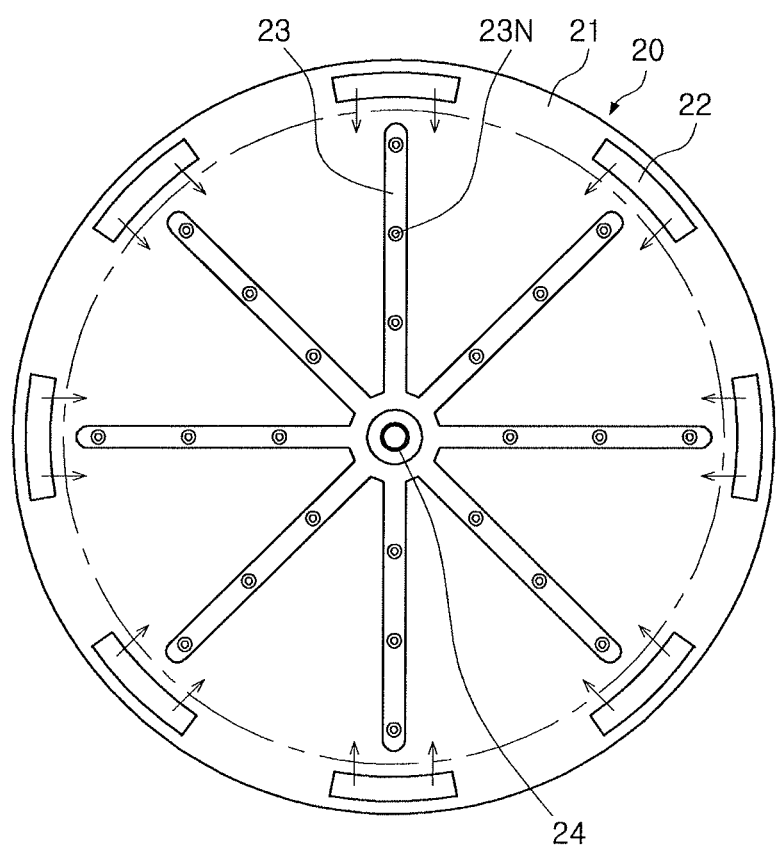
FIG. 2 illustrates a chuck in FIG. 1 when viewed in direction I.
Figure 3:
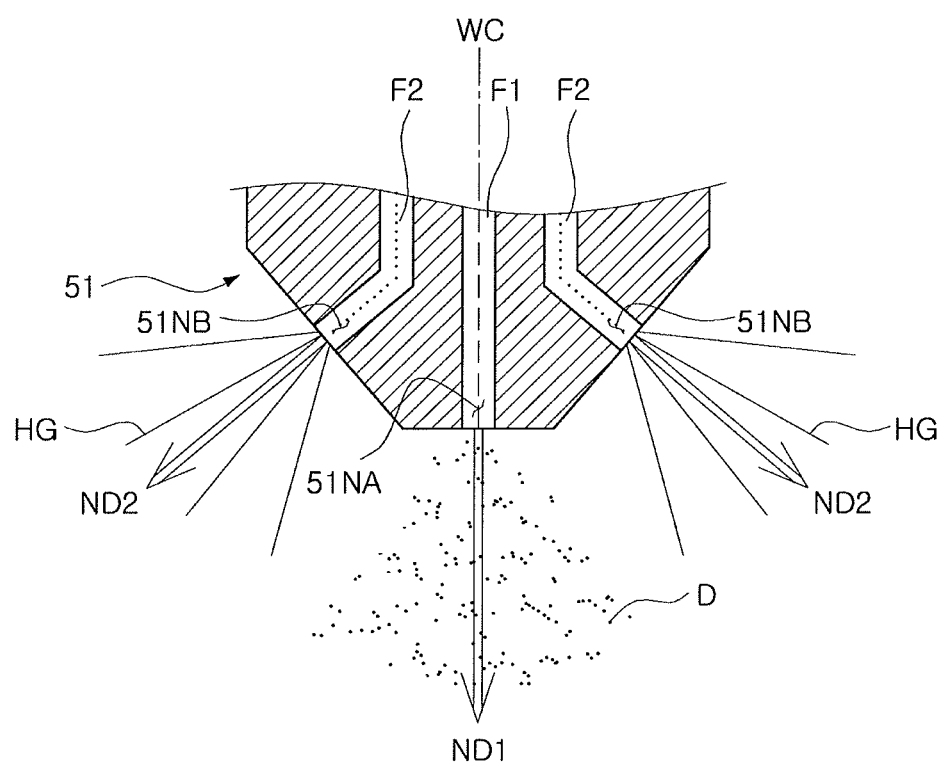
FIG. 3 illustrates an enlarged view of a nozzle head in FIG. 1.
Figure 4:
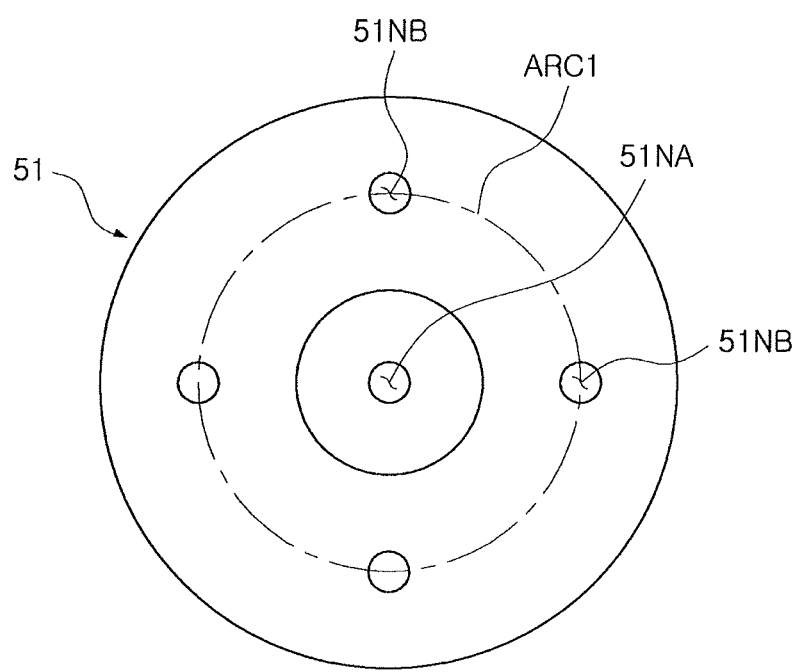
FIG. 4 illustrates the nozzle head in FIG. 3 when viewed in direction II.

A substrate cleaning apparatus according to an example embodiment will be described with reference to FIGS. 1 to 4. FIG. 1 is a schematic diagram illustrating a substrate cleaning apparatus according to an example embodiment, FIG. 2 illustrates a chuck in FIG. 1 when viewed in direction I, FIG. 3 is an enlarged view of a nozzle head in FIG. 1, and FIG. 4 illustrates the nozzle head in FIG. 3 when viewed in direction II.

Referring to FIG. 1, a substrate cleaning apparatus 1 may include a support unit 20, disposed inside a chamber 10, on which a wafer W, e.g., a semiconductor substrate, is loaded, a first supply unit 50 configured to spray a chemical to the wafer W to form a coating film and to inject a hot gas to the wafer W to dry the coating film, and a second supply unit 60 configured to inject a peeling treatment liquid to the formed coating film. In addition, the substrate cleaning apparatus 1 may include a third supply unit 23 configured to heat the wafer W and a fourth supply unit 24 configured to supply a treatment liquid for cleaning and processing the wafer W. In addition, an airflow generation unit 40 may be disposed on an upper portion of the chamber 10. The first supply unit 50 and the second supply unit 60 may be configured to rotate an upper portion of the support unit 20 by a first driver 52 and the second driver 63, respectively, e.g., the first and second drivers 52 and 63 may reciprocate (e.g., rotate) the first supply unit 50 and the second supply unit 60 above the support unit 20. For example, the supply units may be referred to as supply sources.

The substrate cleaning apparatus 1 is configured to remove particles attached to the surface of the wafer W. In the substrate cleaning apparatus 1, a chemical may be sprayed onto the wafer W to form a solidified coating film with particles attached, and the coating film may be peeled off to remove the particles, attached to a surface of the wafer W, together with the coating film.

The support unit 20 may rotate in a circumferential direction of the wafer W while the chemical is sprayed, achieving an entirely uniform thickness of the coating layer formed on the wafer W.

Referring to FIGS. 1 and 2, the support unit 20 may include a bottom portion 21 and a support pin 22 disposed on a circumference of the bottom portion 21, e.g., the support pin 22 may be continuous along an entire circumference of the bottom portion 21 or include discrete and discontinuous portions. The wafer W may be positioned on the bottom portion 21, such that the lower surface W2 of the wafer W faces the bottom portion 21, while the support pin 22 fixes the wafer W, e.g., the support pin 22 contacts a side surface of the wafer W to hold it.

The third supply unit 23 for heating the wafer W in a direction of the lower surface W2 of the wafer W and the fourth supply unit 24 for injecting the treatment liquid to the lower surface W2 of the wafer W may be disposed at the bottom portion 21. For example, as illustrated in FIG. 1, the third supply unit 23 may include a plurality of linear portions between the wafer W and the bottom portion 21 of the support unit 20 to inject hot gas toward the wafer W, while the fourth supply unit 24 may extend through a center of the bottom portion 21 of the support unit 20 to inject the treatment liquid toward the wafer W. The treatment liquid, injected to the lower surface W2 of the wafer W, may be a peeling treatment liquid and a dissolution treatment liquid.

In detail, the third supply unit 23 may be disposed radially on the bottom portion 21. For example, as illustrated in FIG. 2, the third supply unit 23 may include a plurality of linear portions spaced apart from each other and extending radially from a center of the bottom portion 21 toward the circumferential edge of the bottom portion 21, e.g., the plurality of linear portions may overlap the bottom portion 21 of the support unit 20. For example, as illustrated in FIG. 2, each of the plurality of linear portions of the third supply unit 23 may include a pipe extending through a central region of the bottom portion 21 that turns above the bottom portion 21 toward the circumferential edge of the bottom portion 21. The third supply unit 23 may be provided with a plurality of third nozzles 23N through which a hot gas is injected, e.g., a plurality of third nozzles 23N may be spaced apart from each other along each one of the linear portions of the supply unit 23 (FIG. 2).

The fourth supply unit 24 may be disposed in a central region of the bottom portion 21. For example, as illustrated in FIGS. 1-2, the fourth supply unit 24 may extend through a center of the bottom portion 21 and through a center of the third supply unit 23 to have its opening face the lower surface W2 of the wafer W.

The rotation of the support unit 20 is performed such that a droplet of the sprayed liquid may be uniformly seated on the wafer W. For example, the rotation of the support unit 20 may be performed at a relatively low rotational speed, e.g., only to provide for uniform liquid distribution on the wafer W.

In a comparative method, if a liquid chemical were to be applied to a wafer to form a coating film, rotation at high speed would be required to remove an organic solvent from the coating film and to dry the coating film on the wafer, thereby increasing the amount of time required for the process. In contrast, according to embodiments, a hot gas is injected to dry the coating film, thereby rendering rotation of the support unit at high speed unnecessary. Therefore, in an example embodiment, a rotational speed of the support unit 20 may be maintained at a low rotational speed of 1500 revolutions per minute (rpm) or less.

A chamber bowl 30 may be disposed on the circumference of the support unit 20 to prevent the droplet of the chemical and the peeling treatment liquid from being scattered on a sidewall of the chamber 10. For example, as illustrated in FIG. 1, the chamber bowl 30 may surround the bottom of the bottom portion 21 and lateral sides of the support pin 22 of the support unit 20.

An airflow generation unit 40 may be disposed above the support unit 20. The airflow generation unit 40 may be disposed above the support unit 20 to generate a uniform airflow flowing from the upper portion of the chamber 10 to an upper surface of the support unit 20. Thus, the sprayed chemical may be prevented from being scattered outwardly of the chamber bowl 30 to prevent unnecessary coating of the chemical sprayed into a space inside the chamber 10.

Referring to FIGS. 1 and 3, the first supply unit 50 may include a first flow path F1, through which a chemical is supplied to form a coating film on an upper surface W1 of the wafer W, and a second flow path F2 through which a hot gas is supplied. For example, as illustrated in FIG. 1, the first supply unit 50 (i.e., the first supply source) may include two separate pipes therein corresponding to the first and second flow paths F1 and F2 that are connected to the chemical supply unit 100 and the hot gas supply unit 200, respectively. A first nozzle 51NA and a second nozzle 51NB may be disposed at end portions of the first flow path F1 and the second flow path F2, respectively. The first nozzle 51NA and the second nozzle 51NB may be provided on a nozzle head 51 coupled to an end portion of the first supply unit 50. In an example embodiment, the first nozzle 51NA and the second nozzle 51NB have been described as being disposed on a single nozzle head 51. However, this is just an example, and the first nozzle 51NA and the second nozzle 51NB may be disposed on additional nozzle heads, respectively.

The first flow path F1 may connect a chemical supply unit 100 and the first nozzle 51NA to each other to spray the chemical supplied from the chemical supply unit 100 to the first nozzle 51NA. The second flow path F2 may connect the hot gas supply unit 200 and the second nozzle 51NB to each other to spray the hot gas supplied from the hot gas supply unit 200 to the second nozzle 51NB, e.g., the hot gas supply unit 200 may supply already preheated hot gas or include a heater (e.g., an IR or a UV lamp) to heat the supplied gas to a desired temperature.

The chemical is sprayed from the first nozzle 51NA onto the top surface W1 of the wafer W to form a coating film. For example, the chemical in the first flow path F1 may be a solution in which a polymer is dissolved in an organic solvent. The polymer may be, e.g., a material including a polyhydroxy styrene (PHS) resin, and the organic solvent may be, e.g., at least one of isopropyl alcohol (IPA), butanol, and methyl isobutyl carbinol (MIBC), or a mixture thereof.

The hot gas sprayed from the second nozzle 51NB onto the top surface W1 of the wafer W is used to heat the coating film during drying of the coating film (formed by previously spraying the chemical from the first flow path F1), and may heat the coating film to accelerate volatilization of the organic solvent. In an example embodiment, a hot nitrogen ($N_2$) gas may be used as the hot gas.

Referring to FIGS. 3 and 4, the first nozzle 51NA may be disposed in a first direction ND1, i.e., along a direction normal with respect to the upper surface W1 of the wafer W.

The second nozzle 51NB may include a plurality of second nozzles 51NB disposed along the circumference of the first nozzle 51NA. The second nozzle 51NB may be disposed in a second direction ND2, i.e., along a direction oblique to the first direction ND1. The second direction ND2 may be a direction downwardly inclined to face a circumferential region, e.g., a peripheral (e.g., an external) portion of the wafer W. The hot gas, injected through the second nozzle 51NB, may be injected at an angle different from an angle of the droplet D of the chemical sprayed through the first nozzle 51NA. Accordingly, since the hot gas HG is injected to the coating film, formed by spraying the chemical, in a circumferential direction of the wafer W, volatile components, included in the coating film, may be removed more rapidly.

The first direction ND1 of the first nozzle 51NA may be disposed to match, e.g., align with, a central axis WC of the wafer W. The second nozzles 51NB may be disposed at equal intervals on a circumference ARC1 around the first nozzle 51NA, e.g., while being angled at an oblique angle with respect to the first nozzle 51NA. For example, as illustrated I FIG. 4, four second nozzles 51NB may be disposed around the first nozzle 51NA. However, this is just an example, and the number of the first and second nozzles is not limited thereto.

Figure 5:
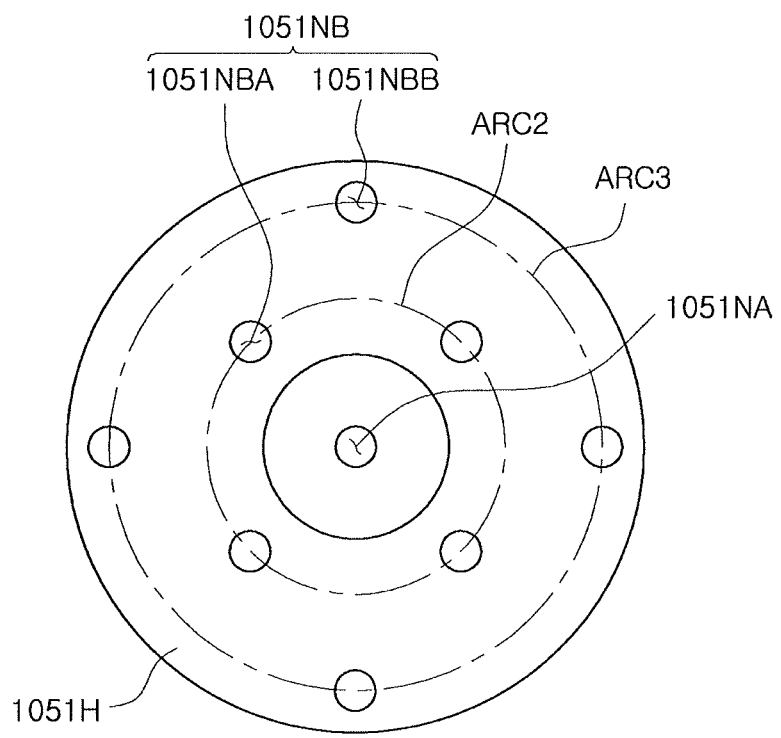
FIG. 5 illustrates a modified example of the nozzle head in FIG. 4.

FIG. 5 illustrates a modified example of the nozzle head in FIG. 4. Referring to FIG. 5, a plurality of second nozzles 1051NB may be arranged at equal distances on a nozzle head 1051H along two circumferences ARC2 and ARC3 around a first nozzle 1051NA. The second nozzles 1051NBA, disposed on a second circumference ARC2, and the second nozzle 1051NBB, disposed on a third circumference ARC3, may be alternately disposed.

Referring back to FIG. 1, the second supply unit 60 may include a fourth nozzle 61 and a fifth nozzle 62.

The fourth nozzle 61 may be connected to a peeling treatment liquid supply unit 300 through a third flow path F3 to inject a peeling treatment liquid to the coating film. The peeling treatment liquid may be a solution in which at least one of, e.g., hydrogen peroxide ($H_2O_2$), hydrogen fluoride (HF), and sulfuric acid ($H_2SO_4$), is mixed with deionized water.

The fifth nozzle 62 may be connected to a dissolving treatment liquid supply unit 400 through a fourth flow path F4 to inject a dissolving treatment liquid to the surface of the wafer W. The dissolving treatment liquid is used to remove residues, which may adhere to the wafer W, after the coating film is removed. The dissolving treatment liquid may be an organic solvent including alcohol, e.g., isopropyl alcohol (IPA), and may be heated to a temperature of about 30° to about 80° (degrees Celsius) to be injected.

Referring to FIGS. 1 and 2, the third supply unit 23 and the fourth supply unit 24 may be disposed on the support unit 20 to supply a hot gas and a treatment liquid to a lower surface W2 of the wafer W.

The third supply unit 23 may be connected to a hot gas supply unit 200 to inject hot gas into the lower surface W2 of the wafer W to heat the wafer W. Accordingly, drying of the coating film, formed on the upper surface W1 of the wafer W, may be accelerated. The hot gas of the third supply unit 23 may be injected from the first supply unit 50 simultaneously with the hot gas, injected from the first supply unit 50, to heat the upper surface W1 and the lower surface W2 of the wafer W at the same time.

The fourth supply unit 24 may be connected to the peeling treatment liquid supply unit 300 and the dissolving treatment liquid supply unit 400 to supply the peeling treatment liquid or the dissolving treatment liquid to the lower surface W2 of the wafer W.

In an example embodiment, a chemical may be sprayed to form a coating film on the upper surface W1 of the wafer W and a hot gas may be injected to promote drying of the coating film, which will be described with reference FIGS. 6A to 6D. FIGS. 6A to 6D illustrate a process in which a droplet, sprayed from a first nozzle, is solidified.

Referring to FIG. 6A, an organic solvent may be volatilized, e.g., evaporated, on a surface E of a droplet D1 from a moment of spraying the droplet D1 from a first nozzle 51NA. The organic solvent may be volatilized to start being removed on the surface E of the droplet D1, but a large amount of the organic solvent may remain in a central portion C. For example, the organic solvent may evaporate from the sprayed droplet D1 to define a droplet D2, e.g., hatched portions of the droplets D1 and D2 show parts of the droplets that include a large amount of polymer material due to evaporation of the organic solvent therefrom.

Referring to FIG. 6B, since a temperature of the droplet D2 (dropped in the chamber 10 after being sprayed from the first nozzle 51NA) is decreased due to the drop of the droplet D2, while still being higher than a temperature in the chamber 10, the organic solvent may continue to be volatilized, e.g., evaporated, on the surface E by the drop of the droplet D2. As can be seen from FIG. 6B, the organic solvent in the central portion C (when the droplet D2 is in the chamber 10) is reduced as compared with the droplet D1 in FIG. 6A (at the time of spraying).

Referring to FIG. 6C, a droplet D3, i.e., when the droplet D2 in the chamber 10 contacts the surface of the wafer W, may be attached to an upper pattern WP of the wafer W to form a coating film. When a hot gas HG is injected to the droplet D3 on the wafer W, volatilization, e.g., evaporation, of the organic solvent from the droplet D3 may be accelerated to solidify the surface E of the droplet D3. In this operation, the droplet D3 (e.g., polymer) is solidified while adsorbing particles P attached to the upper pattern WP of the wafer W. In addition, dropped droplets may be attached to each other and solidified to strongly form a coating film on the wafer W. As described above, since the droplet D3 is dried by spraying hot gas to the coating film formed by the dropped droplet D3, an operation of rotating the support unit at high speed to dry the coating film may be omitted. The coating film, formed by spraying the chemical, may have adsorption power sufficient to remove particles P but may be easily removed as compared with a coating film formed by spraying a chemical. Accordingly, since the coating film may be peeled off from the surface of the wafer W even using a relatively small amount of a peeling treatment liquid, the particles adhered to the wafer W may be removed without damage to a semiconductor pattern on the surface of the wafer W or erosion of a film of the semiconductor pattern.

FIG. 6D illustrates that solidification is performed on the surface E of a droplet D4 by a hot gas to solidify particles P while being adsorbed to the surface E of the droplet D4.

Figure 7:
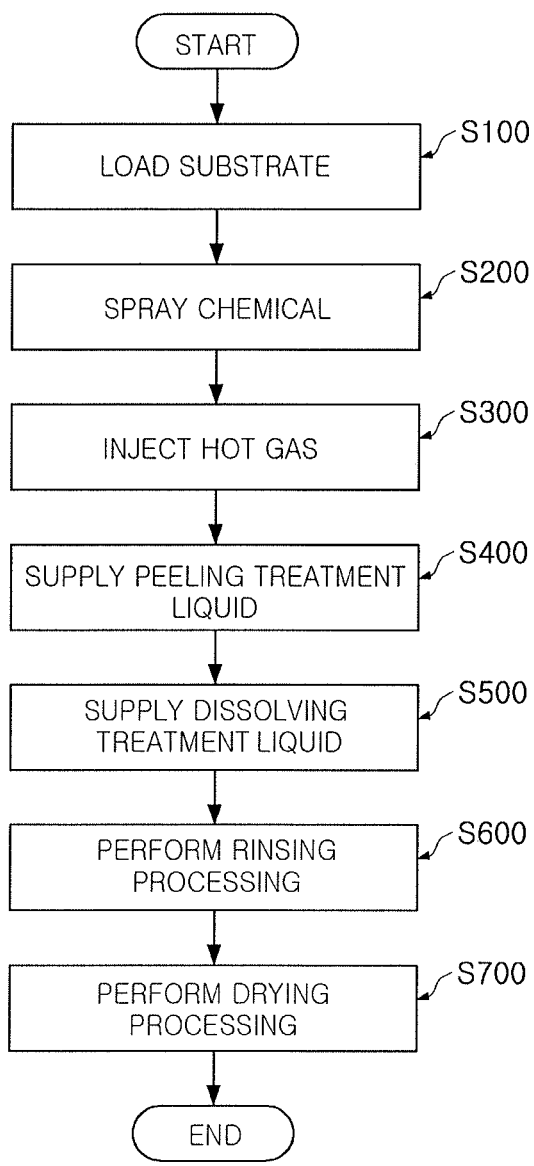
FIG. 7 illustrates a flowchart of a substrate cleaning method according to an example embodiment.

Hereinafter, a substrate cleaning method according to the present disclosure using the above-described substrate cleaning apparatus will be described with reference to FIGS. 7 to 11. FIG. 7 is a flowchart illustrating a substrate cleaning method according to an example embodiment, and FIGS. 8 to 11 are schematic diagrams illustrating stages in a substrate cleaning method according to an example embodiment.

Referring to FIG. 7, a substrate cleaning method may include loading a substrate (S100), spraying a chemical (S200), injecting a hot gas (S300), supplying a peeling treatment liquid (S400), supplying a dissolving treatment liquid (S500), performing rising processing (S600), and performing rising processing (S700). These operations may be performed in the substrate cleaning apparatus 1 of FIG. 1.

Figure 8:
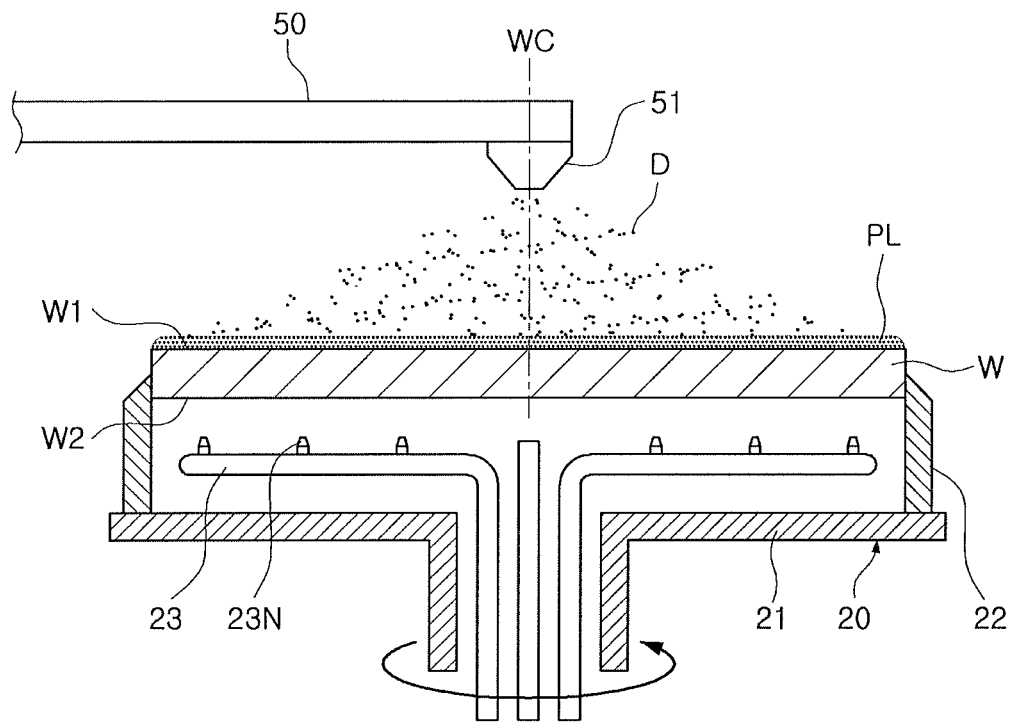
FIGS. 8 to 11 illustrate schematic diagrams of stages in a substrate cleaning method according to an example embodiment.

In detail, referring to FIGS. 7 and 8, the support pin 22 of the support unit 20 may be moved to an outer edge of the bottom portion 21 to accommodate loading of the wafer W on the support unit 20, i.e., on the bottom portion 21 of the support unit 20, followed by moving the support pin 22 to contact an edge of the wafer W to secure the wafer W (S100). Once the wafer W is securely loaded on the support unit 20, as illustrated in FIG. 8, a chemical may be sprayed onto the upper surface W1 of the wafer W, while rotating the support unit 20, to form a coating film PL (S200).

The chemical may be sprayed, i.e., in the form of droplets (D), through the first nozzle 51NA (FIG. 3) of the nozzle head 51 of the first supply unit 50 disposed above the support unit 20. As described above, the chemical may be a solution in which a polymer is dissolved in an organic solvent. The polymer may be a material including, e.g., a polyhydroxy styrene (PHS) resin, and the organic solvent may be at least one of, e.g., isopropyl alcohol (IPA), butanol, and methyl isobutyl carbinol (MIBC), or a mixture thereof. In this case, the support unit 20 may rotate at 1500 rpm or less to uniformly attach the droplets D of the chemical onto the wafer W to form the coating PL.

Figure 9:
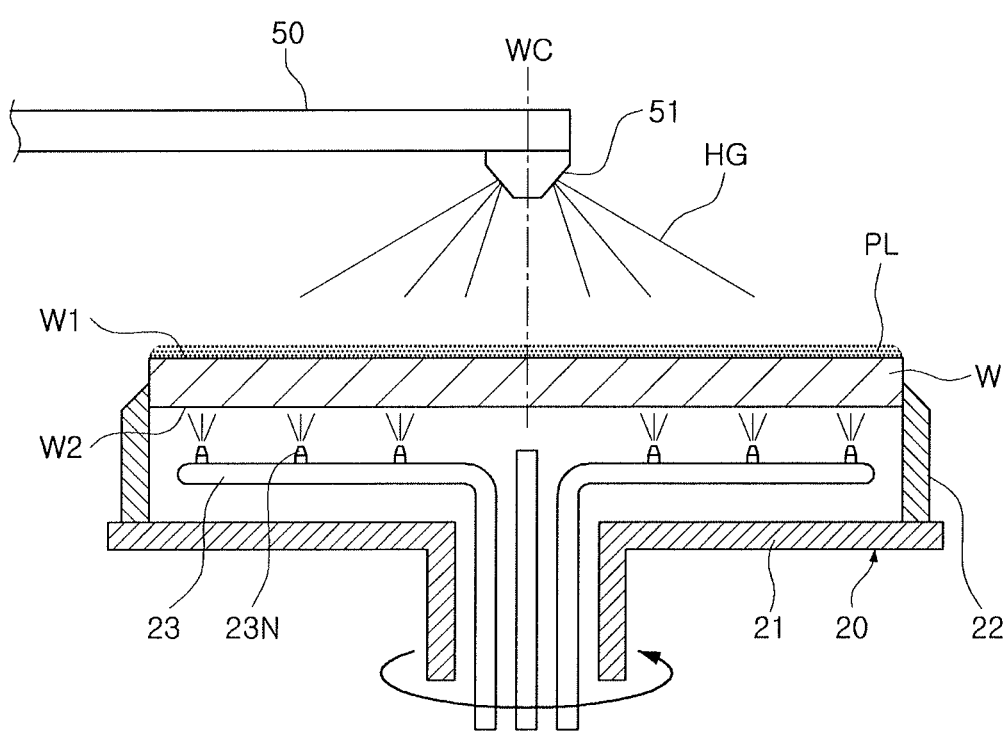

Referring to FIGS. 7 and 9, the hot gas HG may be sprayed from the second nozzle 51NB (FIG. 3) of the nozzle head 51 of the first supply unit 50 onto the coating film PL on the wafer W to accelerate volatilization, e.g., evaporation, of the organic solvent included in the coating film PL (S300). In an example embodiment, a hot nitrogen ($N_2$) gas may be used as the hot gas. The hot gas HG may be injected in an oblique direction relative to a normal to the upper surface W1 of the wafer W, i.e., oriented to face a circumferential direction of the wafer W. For example, the hot gas HG may be injected outwardly of the wafer W, e.g., the second nozzle 51NB may face toward an outermost edge of the wafer W and beyond.

The support unit 20 may rotate at 1500 rpm or less, so the hot gas HG may be uniformly injected onto the upper surface W1 of the wafer W. In this case, the hot gas HG may also be injected to a lower surface W2 of the wafer W through the third nozzles 23N of the third supply unit 23 to heat the entire wafer W. As the wafer W is heated, drying of the coating film PL may be accelerated.

As the drying of the coating film PL is accelerated by the hot gas HG, the droplets D in the coating film PL may be solidified while adsorbing particles attached to the upper surface W1 of the wafer W. In this case, the particles P are adsorbed to the droplets D (FIGS. 6C-6D). For example, as illustrated in FIGS. 6C-6D, each droplet D may contact an entire portion of an outer surface of the particle P not contacting the upper surface W1 of the wafer W. Since a contact area between each droplet D and a respective particle P is larger than a contact area between the respective particle P and the upper surface W1 of the wafer W, the respective particle P may be removed together with the coating film PL (i.e., together with the drop D due to the larger force caused by the larger contact area) when the coating film PL is separated from the upper surface W1 of the wafer W in a subsequent process.

Figure 10:
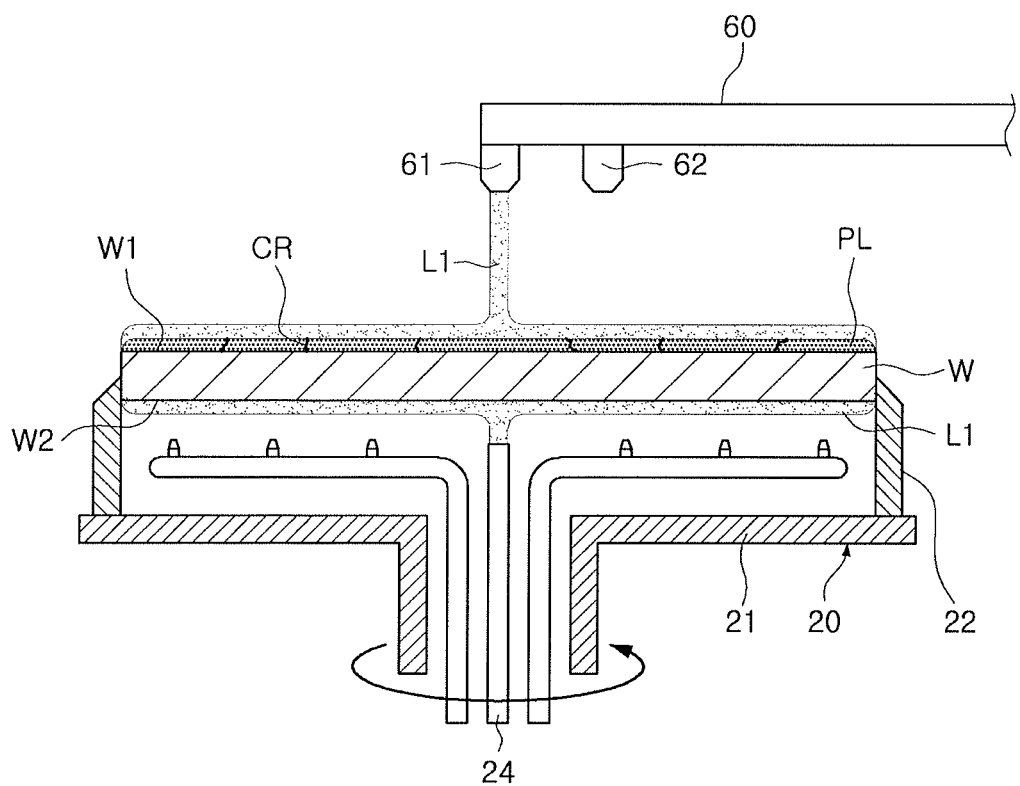

Referring to FIGS. 7 and 10, a peeling treatment liquid L1 may be injected to the upper surface W1 of the wafer W through the fourth nozzle 61 of the second supply unit 60 to remove the coating film PL (S400). The peeling treatment liquid L1 may employ a solution in which at least one of, e.g., hydrogen peroxide water ($H_2O_2$), hydrogen fluoride (HF), and sulfuric acid ($H_2SO_4$) is mixed with deionized water.

When the peeling treatment liquid L1 is injected to the coating film PL, cracking CR may occur in the coating film PL. Thus, the peeling treatment liquid L1 may permeate between the surface of the wafer W, which is hydrophilic, and the coating film PL, which is hydrophobic. Accordingly, the coating film PL may be floated by the peeling treatment liquid L1 to be peeled off from the upper surface W1 of the wafer W. In this case, the support unit 20 may rotate, and thus, the coating film PL, peeled off from the upper surface W1 of the wafer W, may be separated to be discharged outwardly of the support unit 20. As a result, the coating film PL may be peeled off from the wafer W together with the particles P (which were adsorbed to the droplets D in the coating film PL in operations S200 and S300), and the wafer W may be cleaned.

The peeling treatment liquid L1 may also be sprayed onto the lower surface W2 of the wafer W through the fourth supply unit 24 in the same manner to clean the lower surface W2 of the wafer W.

Figure 11:
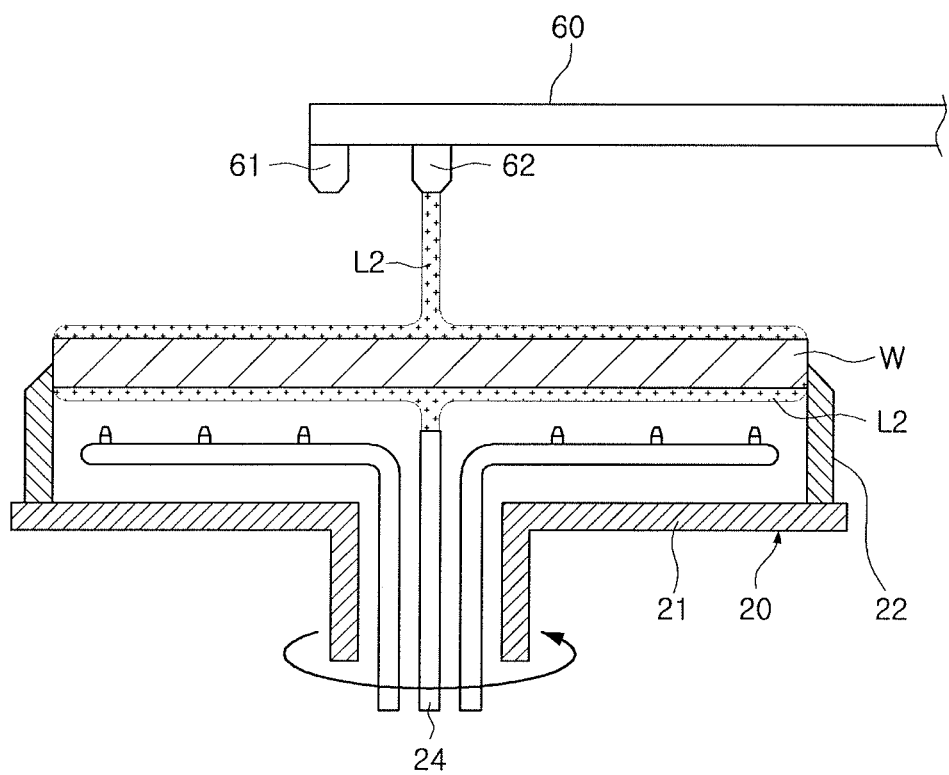

Referring to FIGS. 7 and 11, the dissolving treatment liquid L2 may be injected to the upper surface W1 of the wafer W through the fifth nozzle 62 of the second supply unit 60 to remove residues of the coating film PL which may remain on the upper surface W1 of W (S500). The dissolving treatment liquid L2 may employ an organic solvent including alcohol, e.g., isopropyl alcohol (IPA), and may be heated to a temperature of about 30° to about 80° (degrees Celsius) to be injected. In this case, the dissolving treatment liquid L2 may also be injected to the lower surface W2 of the wafer W through the fourth supply unit 24 in the same manner to remove residues of the coating film PL which may be attached to the lower surface W2 of the wafer W.

Referring back to FIG. 7, rinsing processing may be performed to dilute an alkali or acidic chemical with deionized water and to inject the diluted chemical to the upper surface of the wafer W (S600). Further, drying processing of the wafer W may be performed (S700). In the drying processing, by increasing a rotational speed of the wafer W for a predetermined time, the deionized water, remaining on the upper surface of the wafer W, may be dehydrated during the rinsing processing to dry the wafer W. Then, the rotation of the wafer W may be stopped and cleaning of the wafer W may be completed.

By way of summation and review, as semiconductor patterns become finer, semiconductor patterns may be damaged during particle removal therefrom during manufacturing. For example, even a significantly small external force applied to remove particles from a semiconductor patterns by a cleaning solution may erode the semiconductor pattern.

In contrast, example embodiments provide a substrate cleaning apparatus and a substrate cleaning method capable of removing particles attached to a substrate without damage to a semiconductor pattern of a substrate and erosion of a film of the semiconductor pattern. That is, according to example embodiments, a coating film is formed by spraying a chemical, and a substrate is dried by injecting a hot gas toward an edge direction of the substrate. Since the coating film is formed by spraying the chemical, the amount of the chemical used may be reduced and cleaning may be easily performed. In addition, since the hot gas is injected toward the edge direction of the substrate, drying of the coating film may be facilitated to shorten a time required for a manufacturing process and to reduce manufacturing costs, e.g., as compared to drying by rotation at a high speed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A substrate cleaning apparatus, comprising:
a support inside a chamber, wherein the support is configured to hold a substrate;
a first supply source inside the chamber, the first supply source including a nozzle head having:
a first nozzle along a first direction, the first nozzle facing and pointing toward a center of the support, and the first nozzle being connected to a supply of a mixture of a polymer and a volatile organic solvent,
a second nozzle along a second direction that is at an oblique angle with respect to the first direction, the second nozzle facing and pointing toward an outermost edge of the support, and the second nozzle being connected to a supply of a gas to volatilize the volatile organic solvent;
a second supply source inside the chamber and having a third nozzle, the third nozzle facing and pointing toward the support, and wherein the second supply source is connected to a supply of a peeling treatment liquid; and
a third supply source inside the chamber, the third supply source including:
a first portion extending along the first direction through a center of the support, and
second portions connected to the first portion, the second portions extending radially from the center of the support toward an outer edge of the support along the support, each of the second portions being spaced apart from adjacent ones of the second portions along a circumference of the support and including a plurality of fourth nozzles spaced apart from each other in the radial direction, and wherein the third supply source is configured to inject the gas to heat the substrate.

2. The substrate cleaning apparatus as claimed in claim 1, wherein the first supply source includes:
a first flow path connected to the first nozzle, the mixture of the polymer and the volatile organic solvent being supplied through the first flow path, and the first nozzle being at an end portion of the first flow path; and
a second flow path connected to the second nozzle, the gas being supplied through the second flow path, and the second nozzle being at an end portion of the second flow path.

3. The substrate cleaning apparatus as claimed in claim 2, wherein the first direction is along a direction normal to the support, and the second direction faces a circumferential region of the substrate when the substrate is held by the support.

4. The substrate cleaning apparatus as claimed in claim 2, wherein the first supply source further includes a driver to reciprocate the first nozzle above a central region and a circumferential region of the support.

5. The substrate cleaning apparatus as claimed in claim 1, wherein the gas is heated nitrogen ($N_2$) gas.

6. The substrate cleaning apparatus as claimed in claim 1, wherein the support includes:
a bottom portion to hold the substrate, the first portion of the third supply source extending through a center of the bottom portion; and
a support pin at an edge of the bottom portion to hold and support a circumferential region of the substrate.

7. The substrate cleaning apparatus as claimed in claim 6, wherein the second portions of the third supply source include eight linear second portions spaced apart from each other, the bottom portion of the support being between a bottom of the chamber and the second portions of the third supply source.

8. The substrate cleaning apparatus as claimed in claim 1, further comprising a fourth supply source extending through the center of the support and through a center of the first portion of the third supply source, the fourth supply source being connected to the supply of the peeling treatment liquid.

9. The substrate cleaning apparatus as claimed in claim 6, wherein the support is rotatable.

10. The substrate cleaning apparatus as claimed in claim 9, wherein the first nozzle of the first supply source is aligned with the center of the bottom portion of the support.

11. A substrate cleaning method using the substrate cleaning apparatus of claim 1, the method comprising:
loading the substrate on the support inside the chamber;
spraying the mixture of the polymer and the volatile organic solvent through the first nozzle in the chamber toward the substrate in the first direction such that a coating film is formed on the upper surface of the substrate;
injecting the gas toward the coating film through the second nozzle in the chamber in the second direction that is oblique with respect to the first direction, the gas being a heated gas such that the volatile organic solvent in the coating film on the upper surface of the substrate is volatilized; and
injecting the peeling treatment liquid through the third nozzle in the chamber toward the upper surface of the substrate, such that the coating film is peeled off and removed from the upper surface of the substrate.

12. The substrate cleaning method as claimed in claim 11, wherein the second direction is facing a circumferential region of the substrate.

13. The substrate cleaning method as claimed in claim 11, wherein the organic solvent includes at least one of isopropyl alcohol (IPA), butanol, and methyl isobutyl carbinol (MIBC), or a mixture thereof.

14. The substrate cleaning method as claimed in claim 11, wherein the peeling treatment liquid is a solution including at least one of hydrogen peroxide ($H_2O_2$), hydrogen fluoride (HF), and sulfuric acid ($H_2SO_4$) mixed with deionized water.

15. The substrate cleaning method as claimed in claim 11, further comprising rotating the support with the substrate during spraying of the mixture of the polymer and the volatile organic solvent and during injecting of the gas.

16. The substrate cleaning method as claimed in claim 15, wherein the substrate rotates at 1500 revolution per minute (rpm) or less.

17. The substrate cleaning method as claimed in claim 11, wherein injecting the gas further includes injecting the gas through the plurality of fourth nozzles toward a lower surface of the substrate, the lower surface of the substrate being opposite to the upper surface of the substrate.

18. A substrate cleaning method using the substrate cleaning apparatus of claim 1, the method comprising:
- spraying the mixture of the polymer and the volatile organic solvent onto an upper surface of the substrate, such that droplets of the sprayed mixture form a coating film on the upper surface of the substrate and absorb particles on the upper surface of the substrate;
- injecting the gas toward the coating film in a direction oblique with respect to normal to the upper surface of the substrate, such that the volatile organic solvent in the coating film is volatilized; and
- injecting the peeling treatment liquid toward the coating film to form cracking in the coating film, and wherein peeling treatment liquid is introduced through the cracking into the coating film to peel off the coating film with the absorbed particles from the upper surface of the substrate.

19. The substrate cleaning method as claimed in claim 18, wherein a contact area between each of the droplets and a respective particle is larger than a contact area between the respective particle and the upper surface of the substrate.

20. The substrate cleaning method as claimed in claim 18, further comprising injecting a dissolving treatment liquid to the upper surface of the substrate to remove residues of the coating film remaining on the upper surface of the substrate after peeling off the coating film.

* * * * *